US007195969B2

(12) United States Patent
Chan et al.

(10) Patent No.: US 7,195,969 B2
(45) Date of Patent: Mar. 27, 2007

(54) STRAINED CHANNEL CMOS DEVICE WITH FULLY SILICIDED GATE ELECTRODE

(75) Inventors: Bor-Wen Chan, Hsin-Chu (TW); Yuan-Hung Chiu, Taipei (TW); Han-Jan Tao, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 266 days.

(21) Appl. No.: 11/026,009

(22) Filed: Dec. 31, 2004

(65) Prior Publication Data

US 2006/0148181 A1 Jul. 6, 2006

(51) Int. Cl.
*H01L 21/8238* (2006.01)

(52) U.S. Cl. .................. 438/230; 438/655; 438/938; 257/E21.636

(58) Field of Classification Search ............... 438/230, 438/231, 232, 655, 938; 257/E21.635, E21.636
See application file for complete search history.

(56) References Cited

U.S. PATENT DOCUMENTS 6,436,754 B1* 8/2002 Lee ........................ 438/238
6,929,992 B1* 8/2005 Djomehri et al. ........... 438/199
6,939,814 B2* 9/2005 Chan et al. .................. 438/778

* cited by examiner

*Primary Examiner*—Chandra Chaudhari
(74) *Attorney, Agent, or Firm*—Tung & Associates

(57) ABSTRACT

A strained channel NMOS and PMOS device pair including fully silicided gate electrodes and method for forming the same, the method including providing a semiconductor substrate including NMOS and PMOS device regions including respective gate structures including polysilicon gate electrodes; forming recessed regions on either side of a channel region including at least one of the NMOS and PMOS device regions; backfilling portions of the recessed regions with a semiconducting silicon alloy to exert a strain on the channel region; forming offset spacers on either side of the gate structures; thinning the polysilicon gate electrodes to a silicidation thickness to allow full metal silicidation through the silicidation thickness; ion implanting the polysilicon gate electrodes to adjust a work function; and, forming a metal silicide through the silicidation thickness to form metal silicide gate electrodes.

21 Claims, 4 Drawing Sheets

STRAINED CHANNEL CMOS DEVICE WITH FULLY SILICIDED GATE ELECTRODE

FIELD OF THE INVENTION

This invention generally relates to formation of MOSFET devices in integrated circuit manufacturing processes and more particularly to a strained channel NMOS and PMOS device pair and method of forming the same including fully silicided gate electrodes to improve a drive current.

BACKGROUND OF THE INVENTION

As is well known, increased device density, together with higher speed performance and lower power consumption are major driving forces in integrated circuit manufacturing. CMOS design consideration for high speed digital applications are usually determined by the pull up time and pull down time of each individual gate. Individual gates are associated with a delay time period for signal propagation in PMOS and NMOS gate electrodes. The delay time period, in turn, is inversely proportional to the drive current ($I_{drive}$). It is therefore clear that maximizing the drive current will increase the performance speed or Figure of Merit (FOM) of a CMOS device.

Mechanical stresses are known to play a role in charge carrier mobility which affects several critical parameters including Voltage threshold ($V_T$) shift, drive current saturation ($I_{Dsat}$), and ON/Off current. The effect of induced mechanical stresses to strain a MOSFET device channel region, and the effect on charge carrier mobility is believed to be influenced by complex physical processes related to acoustic and optical phonon scattering. Ideally, an increase in charge carrier mobility will also increase a drive current.

In addition, drive current is affected by gate sheet resistance. Thus the higher the sheet resistance of the gate electrode, the larger the delay time in signal propagation. Approaches in the prior art to reduce gate electrode sheet resistance have included forming silicides in an upper portion of a polysilicon gate electrode as well as forming the gate electrode of a conductive metal.

In addition, due to complex relationships between the thickness of a silicide, which remains about constant with device scaling, and scaling size reductions of the CMOS device, for example including a junction depth of source and drain regions, the problem of current leakage (diode leakage) becomes increasingly problematical at smaller device critical dimensions. Thus, prior art approaches of forming silicided gate electrodes and silicided source and drain regions increasingly leads to short channel effects including current leakage.

Conventional silicided gate electrodes of the prior art have the added liability of suffering poly-depletion effects. For example, when a gate bias is applied to the CMOS device the electrical field formed on the gate dielectric penetrates into the gate electrode causing charge carrier depletion at the electrode/gate interface which thereby decreases drive current and lowers CMOS speed performance.

These and other shortcomings demonstrate a need in the semiconductor device integrated circuit manufacturing art for improved CMOS devices and methods of manufacturing the same to achieve improved CMOS device speed performance including increased drive current.

It is therefore an object of the present invention to provide improved CMOS devices and methods of manufacturing the same to achieve improved CMOS device speed performance including increased drive current, while overcoming other shortcomings of the prior art.

SUMMARY OF THE INVENTION

To achieve the foregoing and other objects, and in accordance with the purposes of the present invention, as embodied and broadly described herein, the present invention provides a strained channel NMOS and PMOS device pair including fully silicided gate electrodes and method for forming the same.

In a first embodiment, the method includes A strained channel NMOS and PMOS device pair including fully silicided gate electrodes and method for forming the same, the method including providing a semiconductor substrate including NMOS and PMOS device regions including respective gate structures including polysilicon gate electrodes; forming recessed regions on either side of a channel region including at least one of the NMOS and PMOS device regions; backfilling portions of the recessed regions with a semiconducting silicon alloy to exert a strain on the channel region; forming offset spacers on either side of the gate structures; thinning the polysilicon gate electrodes to a silicidation thickness to allow full metal silicidation through the silicidation thickness; ion implanting the polysilicon gate electrodes to adjust a work function; and, forming a metal silicide through the silicidation thickness to form metal silicide gate electrodes.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to exemplary NMOS and PMOS MOSFET devices, it will be appreciated that aspects of the present invention may be applied to the formation of any MOSFET device including dual gate or twin gate CMOS inverters where a fully silicided gate electrode is formed to reduce a gate electrode resistance and avoid a poly-depletion effect. It will be appreciated that additional benefits are realized by forming a strained channel region to improve charge carrier mobility, both processes advantageously improving device performance including drive current ($I_{dsat}$) and device speed.

Referring to FIGS. 1A–1H in an exemplary process flow for forming the fully silicided gate electrode CMOS structures of the present invention, are shown cross-sectional schematic views of a portion of a semiconductor wafer at stages of an exemplary production process.

Figure 1A:
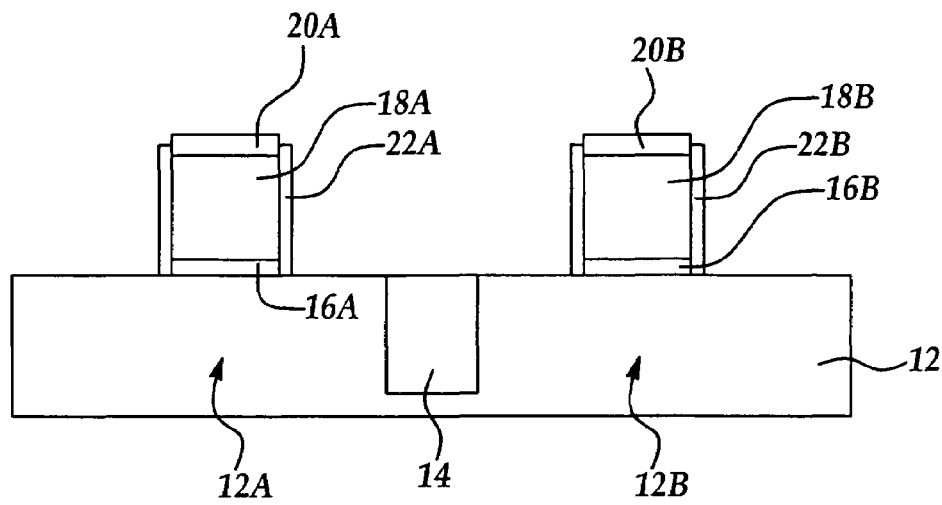
FIGS. 1A–1H are cross sectional schematic views of exemplary portions of a CMOS device including NMOS and PMOS devices at stages of manufacture according to an embodiment of the present invention.

For example, referring to FIG. 1A, is shown a semiconductor substrate 12, which may include silicon, strained semiconductor, compound semiconductor, multi-layered semiconductors, or combinations thereof. For example, the substrate 12 may include, but is not limited to, silicon on insulator (SOI), stacked SOI (SSOI), stacked SiGe on insulator (S—SiGeOI), SiGeOI, and GeOI, or combinations thereof. For example, the substrate may include doped well regions 12A and 12B making up respective NMOS and PMOS device regions formed by conventional methods, for example a masking process followed by ion implantation and activation annealing. Electrical isolation regions optionally separate the NMOS and PMOS device regions, for example, for forming single gate devices and are preferably shallow trench isolation (STI) structures e.g., 14, formed by trench etching and backfilling with an oxide dielectric, for example TEOS silicon oxide, followed by planarization. It will be appreciated that dual or twin gate devices may be formed as well.

Still referring to FIG. 1A, gate structures are formed by conventional processes including a gate dielectric portion e.g., 16A and 16B and overlying polysilicon gate electrode portions e.g., NMOS device gate electrode 18A and PMOS device gate electrode 18B. In an important aspect of the invention the polysilicon gate electrodes are formed by first forming a gate dielectric layer followed by deposition of an undoped polysilicon layer. A hardmask layer of silicon nitride and/or silicon oxynitride is then deposited over the undoped polysilicon layer by conventional CVD processes, e.g., LPCVD or PECVD followed by photolithographic patterning and plasma assisted etching (e.g., RIE) to form the respective NMOS and PMOS gate structures with remaining overlying hardmask layer portions e.g., 20A and 20B.

The gate dielectric portions e.g., 16A and 16B may be formed of silicon oxide, silicon oxynitride, silicon nitride, nitrogen doped silicon oxide, high-K dielectrics, or combinations thereof. The high-K dielectrics may include metal oxides, metal silicates, metal nitrides, transition metal-oxides, transition metal silicates, metal aluminates, and transition metal nitrides, or combinations thereof. The gate dielectric portions e.g., 16A and 16B may be formed by any process known in the art, e.g., thermal oxidation, nitridation, sputter deposition, or chemical vapor deposition. The physical thickness of the gate dielectric portions e.g., 16A and 16B may be in the range of 5 to 100 Angstroms. When using a high permittivity (high-K) gate dielectric, the dielectric constant is preferably greater than about 3.9. The high-K dielectric may be selected from a group comprising aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_2$), yttrium oxide ($Y_2O_3$), lanthanum oxide ($La_2O_3$), cerium oxide ($CeO_2$), titanium oxide ($TiO_2$), tantalum oxide ($Ta_2O_5$), or combinations thereof.

Still referring to FIG. 1A, nitride offset liners e.g., 22A and 22B, are formed along either side of the gate respective NMOS and PMOS gate structure sidewalls by depositing one or more layers of silicon nitride (e.g., $Si_3N_4$) and/or silicon oxynitride (e.g., SiON), followed by wet or dry etching away portions of the one or more layers to form self-aligned offset spacers on either side of the gate structures. The term 'nitride' as used herein is intended to include both nitrides and oxynitrides.

Figure 1B:
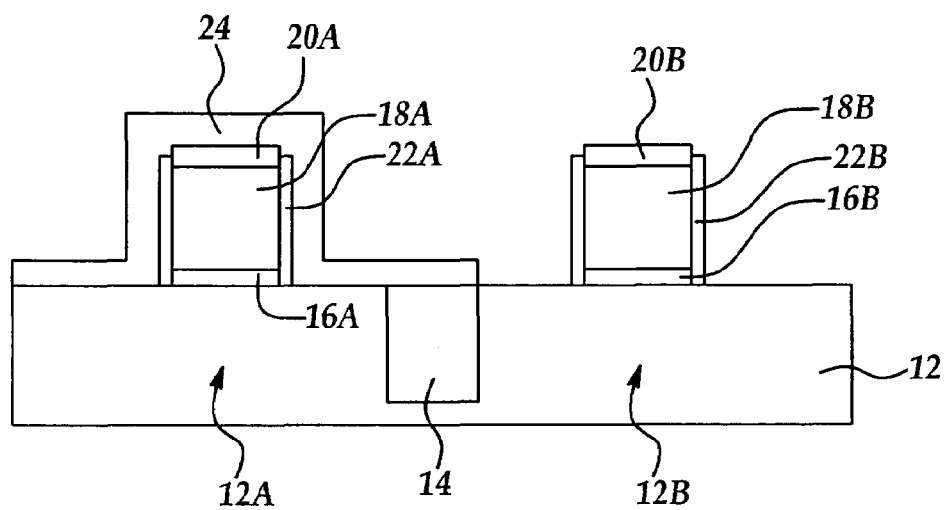

Referring to FIG. 1B, in an important aspect of the invention, a protective oxide layer portion e.g., 24 is formed overlying the NMOS device region e.g., 12A, including the gate structure. For example, a silicon oxide layer is first formed over the process surface by a conventional CVD deposition process using a furnace or rapid temperature process (RTP), also referred to as rapid process oxidation.

The protective oxide layer is then patterned by a conventional lithographic process and a wet and/or dry silicon oxide etching process is then carried out to leave the protective oxide layer portion e.g., 24 overlying the NMOS device region 12A and leave portions of the substrate 12 exposed adjacent the PMOS gate structure over the PMOS device regions 12B.

Figure 1C:
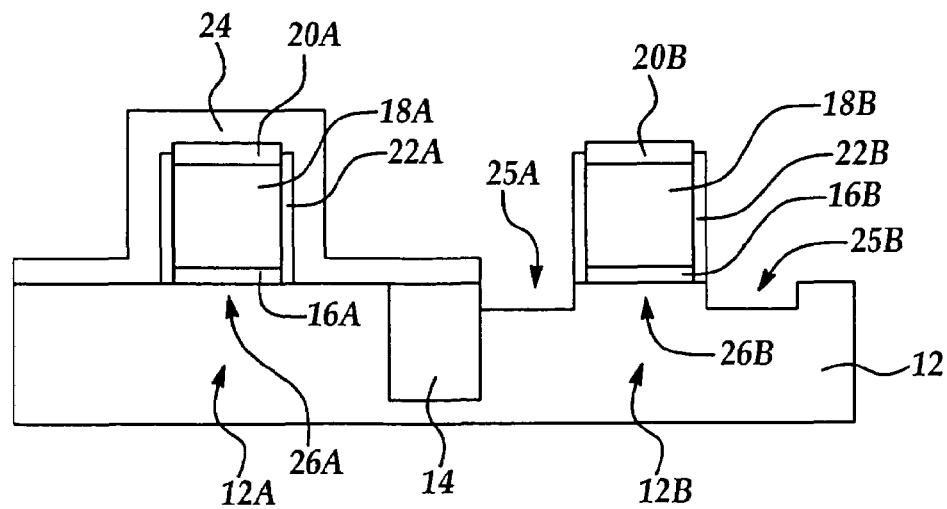

Referring to FIG. 1C, the substrate in the PMOS region 12B is then subjected to a conventional wet or dry etching process, preferably a dry etching process, to etch recessed areas e.g., 25A and 25B into exposed portions of the substrate 12 on adjacent the PMOS gate structure and on either side of the PMOS channel region 26B. The recessed areas e.g., 25A and 25B subsequently form portions of source and drain (S/D) regions in a completed CMOS (PMOS) device. The depth of the recessed areas will vary depending on the desired level of stress desired to be subsequently exerted on the channel region e.g., 26B disposed between the recessed areas as explained below, for example from about 10 Angstroms to about 800 Angstroms, more preferably from about 200 to about 400 Angstroms.

Figure 1D:
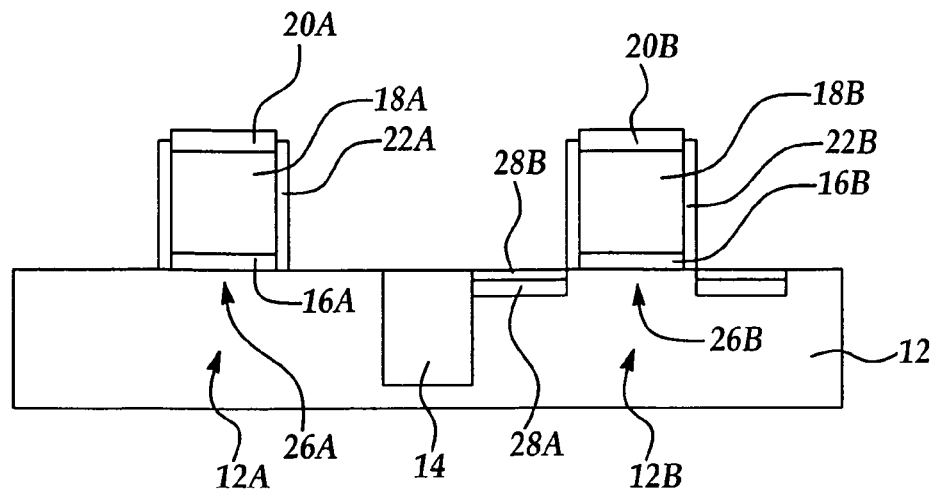

Referring to FIG. 1D, a strained silicon alloy composite e.g., 28A including silicon and an element having a larger atomic radius is deposited to form a first strained semiconducting composite to backfill a first portion of the first recessed areas 25A and 25B. In a preferred embodiment, the first strained silicon alloy composite 28A is formed of SiGe, and is grown in the recessed areas 25A and 25B by a conventional SiGe growth process, e.g., epitaxial. It will be appreciated that the upper level of the backfilled strained silicon alloy composite 28A may be formed at about the same level, or slightly above or below the silicon substrate 12 level, e.g., from about 1 to 20 Angstroms, but is preferably formed slightly below the substrate level. The first strained silicon alloy composite advantageously exerts a compressive stress on the channel region 26B disposed between the backfilled recessed regions 25A and 25B. Still referring to FIG. 1D, an epitaxially grown silicon layer 28B is then deposited on the strained silicon alloy composite 28A to complete filling of the recessed areas 25A and 25B. The protective oxide layer 24 is then removed, preferably by a wet stripping process, e.g., dilute HF.

Figure 1E:
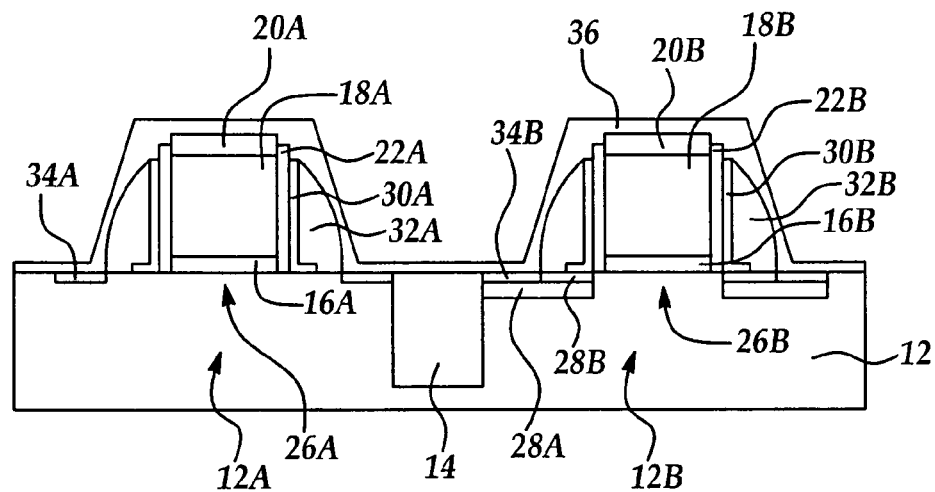

Referring to FIG. 1E, conventional ion implantation processes are carried out form LDD doped regions including pocket implant regions (not shown) adjacent the gate electrodes. Sidewall spacers e.g., 32A and 32B, are then formed adjacent the nitride offset spacers. For example in the exemplary embodiment as shown, oxide liners e.g., 30A, 30B are first formed over the nitride offset spacers e.g., 22A, 22B by conventional deposition and etch processes followed by formation of an outermost silicon nitride or silicon oxynitride spacer e.g., 32A and 32B. It will be appreciated that other types of spacers may be used including outermost oxide spacers or spacers with substantially vertical sidewalls. It will be appreciated that the outermost spacers, when formed of a nitride and/or oxynitride may optionally be formed in a compressive or tensile stress, preferably a tensile stress for the NMOS device and compressive stress for the PMOS device to introduce a strain into the channel region for improved charge mobility. Preferably, the sidewall spacers 32A and 32B are formed at a height lower than the hardmask layer level, e.g., 20A, 20B by conventional etchback processes to remain intact following a subsequent CMP process explained below. A conventional S/D ion implant is then carried out to form S/D regions (not shown) adjacent the sidewall spacers.

Still referring to FIG. 1E, metal silicide regions are formed in a conventional self-aligned silicided process (salicide) to form metal silicides e.g., e.g., 34A, 34B over the source and drain regions. For example the metal suicides may be formed by depositing a metal, e.g., Ti, Co, W, Ni, or Pt, most preferably Co or Ni, over the process surface followed by an RTP annealing process to form the low resistance phase of the silicide e.g., $TiSi_2$, $CoSi_2$, $WSi_2$, NiSi, or PtSi.

Still referring to FIG. 1E a contact etch stop layer 36, preferably silicon nitride and/or silicon oxynitride is then blanket deposited over the process surface to cover both the NMOS and PMOS device regions. It will be appreciated that the contact etch stop layer 36 may optionally be formed in a compressive or tensile stress, for example a tensile stress to improve the charge mobility of the NMOS device and a compressive stress to improve the charge mobility of the PMOS device by introducing strain into the channel regions e.g., 26A and 26B for improved charge mobility.

Figure 1F:
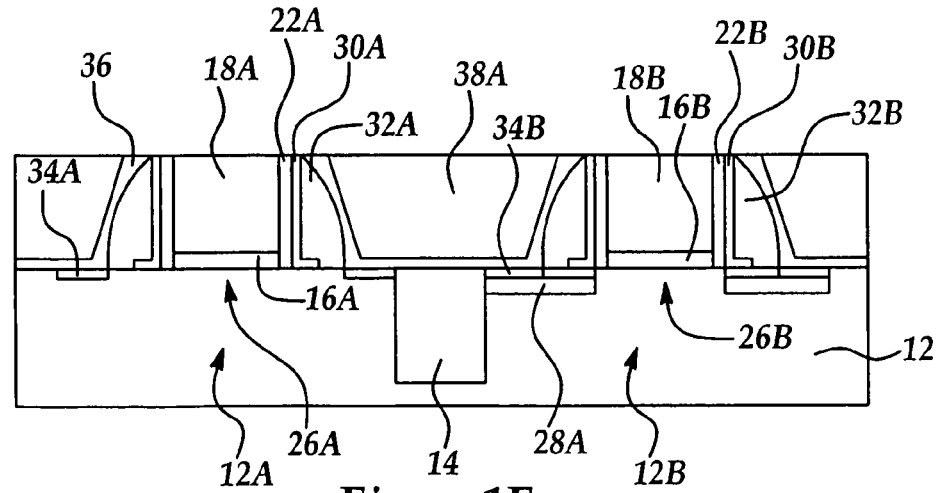

Referring to FIG. 1F, in an important aspect of the invention, an ILD (dielectric insulating layer) 38A is formed over the process surface by a conventional CVD or spin-on process, followed by a chemical mechanical polish (CMP) process, where the hardmask layer portions e.g., 20A and 20B are removed and the undoped polysilicon upper portion of the gate electrodes e.g., 18A, 18B is exposed. The ILD layer 38A may be formed of P doped silicate glass (PSG), PECVD silicon oxide, PETEOS, BPTEOS, BTEOS, or PTEOS, more preferably PSG.

Figure 1G:
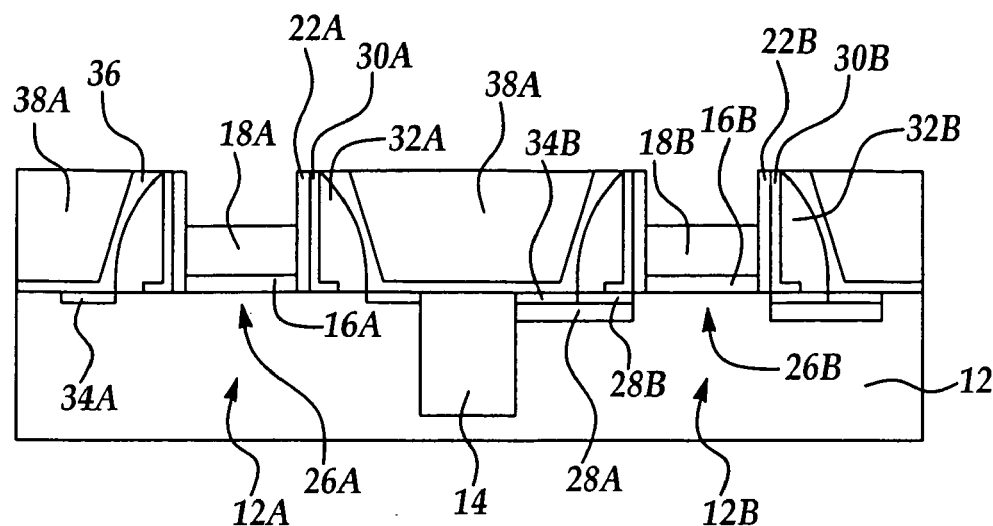

Referring to FIG. 1G, in an important aspect of the invention, a conventional dry polysilicon etchback process is carried out to etchback a thickness portion of the gate electrodes e.g., 18A and 18B, followed by a conventional wet cleaning process, e.g., using SC1 and/or SC2 leaning solutions. It will be appreciated that the remaining thickness portions of the polysilicon gate electrodes following etchback may be between about 100 Angstroms and about 1000 Angstroms in thickness, more preferably between about 200 Angstroms to about 500 Angstroms, preferably being sufficiently thin to allow full metal silicidation of the remaining thickness portions.

Prior to gate electrode silicidation, in an important aspect of the invention, an ion implant process is carried out to dope the respective NMOS and PMOS gate electrodes e.g., 18A and 18B with respective conventional N and P dopants to a sufficient concentration to adjust the polysilicon work function to avoid polysilicon/gate dielectric depletion layer formation during device operation. Preferably, the work function of the NMOS gate electrode is adjusted to between about 4.0 and about 4.5 eV while the PMOS gate electrode is adjusted to between about 4.5 and about 5.0 eV. Following ion implantation, a gate electrode silicidation process is carried out to form a metal silicide extending through the remaining thickness portion of the gate electrodes 18A and 18B. The same preferred metals and processes as outlined for the source/drain silicidation process is preferably carried out, most preferably forming either $CoSi_2$ or NiSi gate electrodes.

Figure 1H:
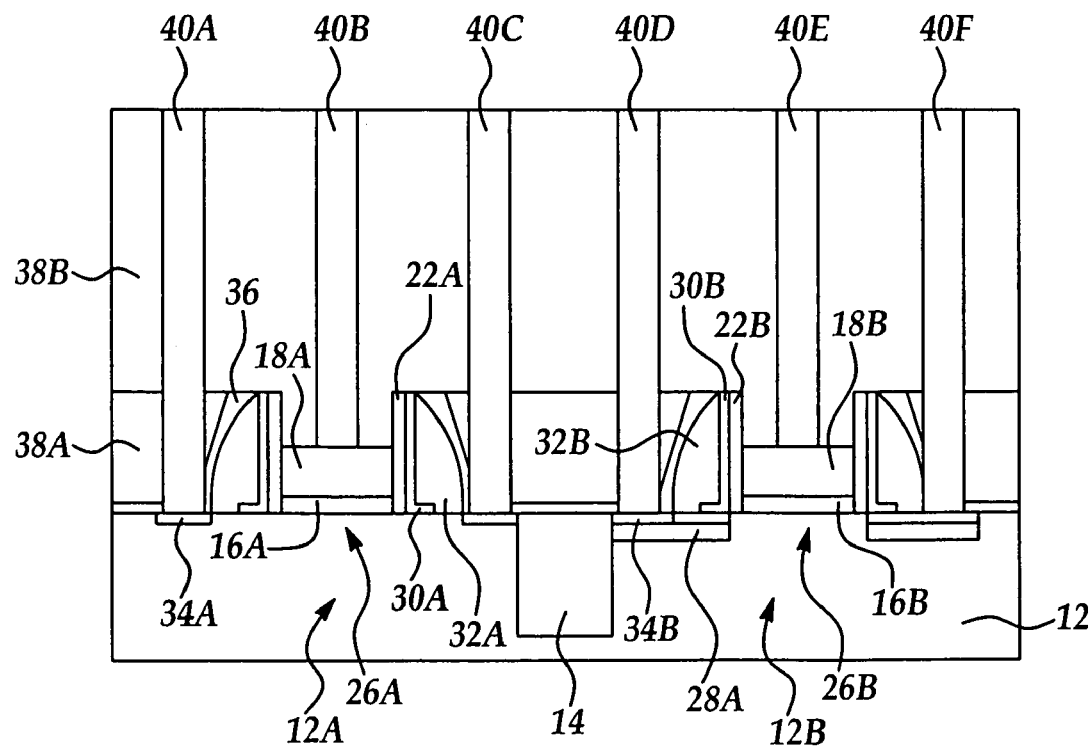

Referring to FIG. 1H, at least one additional ILD layers e.g., 38B is deposited over the first ILD layer 38A, for example using the same preferred oxides as outlined for ILD layer 38A, followed by planarization and conventional metal damascene formation processes to form wiring interconnects to the S/D regions and gate electrodes. For example, tungsten filled damascenes e.g., 40A, 40B, 40C, 40D, 40E, and 40F are formed including barrier layers e.g., Ti, TiN, Ta, TaN, or WN (not shown) lining the damascene openings.

It will be appreciated that the above process steps may be carried out with respect to the opposite polarity (conductivity type) devices, for example where recessed areas are formed on either side of the NMOS channel region 26A, and a strained semiconducting silicon alloy with a contracted lattice parameter respect to silicon, e.g., SiC, is used to backfill the recessed area to form a tensile strain on the NMOS device channel region. It will additionally be appreciated that both NMOS and PMOS devices may be formed with respective channel regions in respective tensile and compressive strain to respectively improve electron and hole mobility.

Figure 2:
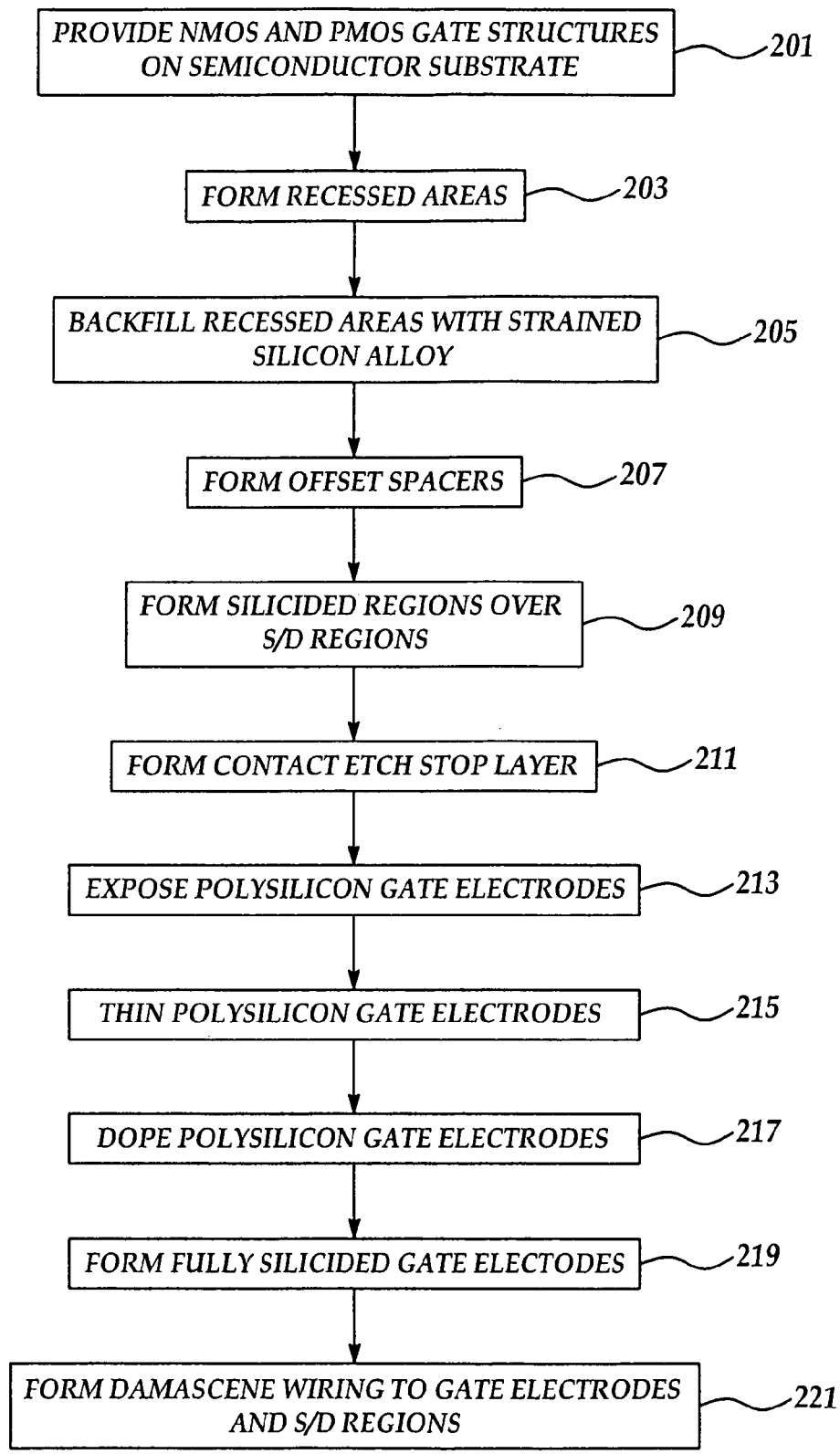
FIG. 2 is a process flow diagram including several embodiments of the present invention.

Referring to FIG. 2 is a process flow diagram including several embodiments of the present invention. In process 201, PMOS and NMOS gate structure are provided on a semiconductor substrate including offset liners. In process 203, recessed areas are formed adjacent one of the PMOS and NMOS (e.g., PMOS) gate structures. In process 205, portions of the recessed areas are backfilled with a strained semiconducting silicon alloy, followed by an overlying silicon layer. In process 207, ion implant processes are carried out before and after formation of offset spacers. In process 209, first metal silicide regions are formed over S/D regions. In process 211, a contact etch stop layer is deposited. In process 213, a first ILD layer is deposited and planarized to expose the polysilicon gate electrodes. In process 215, the polysilicon gate electrodes are thinned to allow full metal silicidation. In process 217, the polysilicon gate electrodes are doped to adjust a work function. In process 219, fully metal silicided gate electrodes are formed. In process 221, a second ILD layer is formed and metal damascenes formed to contact S/D regions and gate electrodes.

Thus a PMOS and NMOS device pair and method for forming the same has been presented for applying a selected type of stress to the channel region of an FET device by backfilling recessed areas formed in source/drain regions with a strained semiconducting material to improve charge mobility and thereby improving device performance including drive current ($I_{dsat}$) and device speed. In addition, by forming fully silicided gate electrodes with a reduced thickness, electrical resistance of the gate electrode is reduced, and the work function is more easily adjusted as well to avoid a depletion effect thereby additionally improving device performance including drive current ($I_{dsat}$) and device speed.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a NMOS and PMOS device pair including fully silicided gate electrodes comprising the steps of:
   providing a semiconductor substrate comprising NMOS and PMOS device regions comprising respective gate structures comprising polysilicon gate electrodes;
   forming recessed regions on either side of a channel region comprising at least one of the NMOS and PMOS device regions;
   backfilling portions of the recessed regions with a semiconducting silicon alloy to exert a strain on the channel region;

forming spacers on either side of the gate structures;
thinning the polysilicon gate electrodes to a silicidation thickness to allow full metal silicidation through the silicidation thickness;
ion implanting the polysilicon gate electrodes to adjust a work function; and,
forming a metal silicide through the silicidation thickness to form metal silicide gate electrodes.

2. The method of claim 1 wherein the thickness of the metal silicide electrodes is less than the maximum offset spacer width.

3. The method of claim 1, wherein the offset spacers comprise a material selected from the group consisting of silicon nitride, silicon oxynitride, and silicon oxide.

4. The method of claim 1, wherein offset liners are formed are formed adjacent either side of the gate structures prior to the step of forming recessed regions.

5. The method of claim 1, further comprising the step of forming a silicon layer over the semiconducting silicon alloy following the step of backfilling.

6. The method of claim 1, wherein the recessed regions are formed adjacent only the PMOS channel region.

7. The method of claim 1, wherein the semiconducting silicon alloy comprises an expanded lattice parameter compared to silicon to form a compressive strain.

8. The method of claim 1, wherein the semiconducting silicon alloy comprises silicon and germanium.

9. The method of claim 1, wherein source and drain metal silicides are formed over respective source and drain regions comprising the respective device regions prior to the step of thinning.

10. The method of claim 1, wherein the step of thinning comprises the steps of:
forming a first ILD layer over the gate structures;
carrying out a CMP process to expose polysilicon comprising an upper portion of the polysilicon gate electrodes; and,
etching back the polysilicon gate electrodes to the silicidation thickness.

11. The method of claim 1, wherein a nitride contact etch stop layer is formed over the respective device regions prior to the step of thinning.

12. The method of claim 11, wherein the nitride contact etch stop layer is formed in one of compressive and tensile stress.

13. The method of claim 1, wherein a depth of the recessed regions is from about 10 Angstroms to about 800 Angstroms.

14. The method of claim 1, wherein a depth of the recessed regions is from about 10 Angstroms to about 50 Angstroms.

15. The method of claim 1, wherein the silicidation thickness is from about 100 Angstroms to about 1000 Angstroms.

16. The method of claim 1, wherein the silicidation thickness is from about 200 Angstroms to about 500 Angstroms.

17. The method of claim 1, wherein the work function of the NMOS polysilicon gate electrode is adjusted to between about 4.0 and about 4.5 eV.

18. The method of claim 1, wherein the work function of the PMOS polysilicon gate electrode is adjusted to between about 4.5 and about 5.0 eV.

19. The method of claim 1, wherein the metal silicide gate electrodes consist essentially of a material selected from the group consisting of titanium silicide, cobalt silicide, nickel silicide, tungsten silicide and platinum silicide.

20. The method of claim 1, wherein the polysilicon gate electrodes comprise undoped polysilicon prior to the step of ion implanting.

21. A method for forming a NMOS and PMOS device pair including fully silicided gate electrodes comprising the steps of:
providing a semiconductor substrate comprising NMOS and PMOS device regions comprising respective gate structures comprising undoped polysilicon gate electrodes;
forming recessed regions on either side of a channel region comprising at least one of the NMOS and PMOS gate structures;
backfilling portions of the recessed regions with a semiconducting silicon alloy to exert a strain on the channel region;
forming a silicon layer on the semiconducting silicon alloy;
forming spacers on either side of the gate structures;
forming first metal silicided regions over respective NMOS and PMOS source and drain regions;
thinning the polysilicon gate electrodes to a silicidation thickness to allow full metal silicidation through the silicidation thickness;
ion implanting the polysilicon gate electrodes to adjust a work function; and,
forming second metal silicide regions extending through the silicidation thickness to form metal silicide gate electrodes.

* * * * *